United States Patent
Dong

(10) Patent No.: US 10,546,535 B2
(45) Date of Patent: Jan. 28, 2020

(54) PIXEL DRIVING CIRCUIT AND DRIVING METHOD OF THE SAME, DISPLAY APPARATUS

(71) Applicant: BOE TECHNOLOGY GROUP CO., LTD., Beijing (CN)

(72) Inventor: Tian Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 95 days.

(21) Appl. No.: 15/769,018

(22) PCT Filed: Sep. 27, 2017

(86) PCT No.: PCT/CN2017/103708
§ 371 (c)(1),
(2) Date: Apr. 17, 2018

(87) PCT Pub. No.: WO2018/166172
PCT Pub. Date: Sep. 20, 2018

(65) Prior Publication Data
US 2019/0156750 A1 May 23, 2019

(30) Foreign Application Priority Data

Mar. 17, 2017 (CN) .......................... 2017 1 0161844

(51) Int. Cl.
*G09G 3/3233* (2016.01)
*G09G 3/3258* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC combination set(s) only.
See application file for complete search history.

(56) References Cited

U.S. PATENT DOCUMENTS

2007/0040772 A1* 2/2007 Kim ................. G09G 3/3233
345/76
2013/0069852 A1* 3/2013 Liao ................. G09G 3/3233
345/77
(Continued)

FOREIGN PATENT DOCUMENTS

| CN | 104409042 A | 3/2015 |
| CN | 104575398 A | 4/2015 |

(Continued)

OTHER PUBLICATIONS

International Search Report of PCT/CN2017/103708 in Chinese, dated Jan. 3, 2018 with English translation.
(Continued)

*Primary Examiner* — Temesghen Ghebretinsae
*Assistant Examiner* — Sosina Abebe
(74) *Attorney, Agent, or Firm* — Collard & Roe, P.C.

(57) ABSTRACT

There are provided a pixel driving circuit and a driving method thereof, and a display apparatus. The pixel driving circuit includes a reset unit 1 configured to write a first power supply voltage of a first power supply voltage terminal into a first terminal of a capacitor; a data writing unit 2 configured to write a data signal of a data signal terminal 7 into a second terminal of the capacitor; a compensation unit 3 configured to provide a reference voltage of a reference voltage signal terminal 6 to a first node S, and write a voltage of the first node S into the second terminal of the capacitor; a light emitting control unit 4 configured to provide light emitting current to a light emitting device 5 for making it emit light, and to reduce the voltage of the first node S.

13 Claims, 3 Drawing Sheets

(51) Int. Cl.
  *G09G 3/3266* (2016.01)
  *H01L 27/32* (2006.01)
  *G09G 3/3291* (2016.01)

(52) U.S. Cl.
  CPC ....... *G09G 3/3291* (2013.01); *H01L 27/3276* (2013.01); *G09G 2300/0426* (2013.01); *G09G 2310/0278* (2013.01); *G09G 2320/0233* (2013.01)

(56) References Cited

U.S. PATENT DOCUMENTS

| | | | | |
|---|---|---|---|---|
| 2014/0078028 A1* | 3/2014 | Qing | .................... | G09G 3/3233 345/77 |
| 2014/0168048 A1* | 6/2014 | Shao | ................... | G11C 19/28 345/100 |
| 2014/0292740 A1* | 10/2014 | Tseng | .................... | G09G 3/3258 345/212 |
| 2015/0084842 A1* | 3/2015 | Kim | .................... | G09G 3/3233 345/76 |
| 2015/0302798 A1* | 10/2015 | Tan | .................... | G09G 3/3233 345/698 |
| 2016/0232836 A1* | 8/2016 | Yang | .................... | G09G 3/3233 |
| 2016/0240139 A1* | 8/2016 | Yang | .................... | G09G 3/3233 |
| 2016/0267843 A1* | 9/2016 | Wang | .................... | G09G 3/3233 |
| 2016/0284269 A1* | 9/2016 | Sun | .................... | G09G 3/3233 |
| 2016/0284280 A1* | 9/2016 | Mu | .................... | G09G 3/3258 |
| 2016/0307504 A1* | 10/2016 | Hung | .................... | G09G 3/3233 |
| 2016/0351123 A1* | 12/2016 | Qing | .................... | G09G 3/3275 |
| 2017/0011684 A1 | 1/2017 | Nakatani | | |
| 2017/0162118 A1 | 6/2017 | Liu et al. | | |
| 2018/0082636 A1* | 3/2018 | Cai | .................... | G09G 3/3258 |

FOREIGN PATENT DOCUMENTS

| | | |
|---|---|---|
| CN | 104978926 A | 10/2015 |
| CN | 105679242 A | 6/2016 |
| CN | 105789250 A | 7/2016 |
| CN | 106652904 A | 5/2017 |

OTHER PUBLICATIONS

Notice of Transmittal of the International Search Report of PCT/CN2017/103708 in Chinese, dated Jan. 3, 2018.

Written Opinion of the International Searching Authority of PCT/CN2017/103708 in Chinese, dated Jan. 3, 2018 with English translation.

* cited by examiner

PIXEL DRIVING CIRCUIT AND DRIVING METHOD OF THE SAME, DISPLAY APPARATUS

CROSS REFERENCE TO RELATED APPLICATIONS

This application is the National Stage of PCT/CN2017/103708 filed on Sep. 27, 2017, which claims the priority under 35 U.S.C. § 119 of a Chinese patent application No. 201710161844.8 filed on Mar. 17, 2017, with an invention title of "PIXEL DRIVING CIRCUIT AND DRIVING METHOD OF THE SAME, DISPLAY APPARTAUS. Herein, the content disclosed by the Chinese patent application is incorporated in full by reference as a part of the present application.

TECHNICAL FIELD

The present disclosure relates to a field of an organic light-emitting display technique, in particular to a pixel driving circuit and a driving method of the same, and a display apparatus.

BACKGROUND

An organic light-emitting diode (herein after referred to as OLED) display has many advantages such as self-illumination, fast response speed, high contrast ratio, wide angle of view and so on. The OLED has been applied in a display apparatus more and more widely.

Since a size of a conventional OLED display is not very large, length of each power supply wire between a power source in a power supply circuit and each pixel point is not very long, that is, a resistance value of the respective power supply wire is very small. Therefore, in operation process of the OLED display, resistance drop (IR drop) on the power supply wire of the OLED display is very small, and thus voltages of respective pixel points are almost consistent, and each pixel point emits lights having same luminance. Therefore, the problem of non-uniform lumination of the OLED display does not exist. However, as the size of the OLED display becomes large increasingly, it would cause the length of each power supply wire between a power source in the power supply circuit and each pixel point to increase, that is, the resistance value of the power supply wire increases, such that the resistance drop (IR drop) on the power supply wire of the OLED display increases in the operation process of the OLED display. As a result, voltages of pixel points of different areas in the OLED display are inconsistent, and pixel points of different areas emit lights having different degrees of lumination, thereby causing non-uniform luminance of the screen of the OLED display in the operation process.

SUMMARY

There is provided in the present disclosure a pixel driving circuit and a driving method of the same, and a display apparatus, which are used to enhance uniformity of luminance of a OLED display screen.

According to one aspect of the present disclosure, there is provided a pixel driving circuit, comprising: a capacitor, a reset unit, a data writing unit, a compensation unit, a light emitting control unit, a driving transistor and a light emitting device; the reset unit, being connected to a first power supply voltage terminal, a first control signal terminal, a second control signal terminal, a first terminal of the capacitor, a first electrode of the driving transistor and a control terminal of the driving transistor, and configured to write a first power supply voltage of the first power supply voltage terminal into the first terminal of the capacitor under control of a first control signal of the first control signal terminal and a second control signal of the second control signal terminal; the data writing unit, being connected to the second control signal terminal, a data signal terminal and a second terminal of the capacitor, and configured to write a data signal of the data signal terminal into the second terminal of the capacitor under control of the second control signal of the second control signal terminal; the compensation unit, being connected to the second control signal terminal, a third control signal terminal, a reference voltage signal terminal, the second terminal of the capacitor and a first node, wherein the first node is a connection point for a second electrode of the driving transistor, the compensation unit and the light emitting control unit, and the compensation unit being configured to provide a reference voltage of the reference voltage signal terminal to the first node under control of the second control signal of the second control signal terminal, and to write a voltage of the first node into the second terminal of the capacitor under control of a third control signal of the third control signal terminal; the light emitting control unit, being connected to the third control signal terminal, the first node and a first terminal of the light emitting device, and configured to provide a light emitting current to the light emitting device for making it emit light and to reduce the voltage of the first node under control of the third control signal of the third control signal terminal; the first terminal of the capacitor being connected to the control terminal of the driving transistor; a second terminal of the light emitting device being connected to a second power supply voltage terminal.

Compared with the prior art, the pixel driving circuit provided in the present disclosure has following beneficial effects: a threshold voltage of the driving transistor and the IR drop of the power supply wires are compensated, so that magnitude of current flowing through the driving transistor is under control of the reference voltage signal and the data signal, being independent of the threshold voltage Vth of the driving transistor, and independent of a power supply signal and a negative electrode of the power supply, which eliminates the influence of the threshold voltage of the driving transistor, the power supply signal and the negative electrode of the power supply on the current flowing through the light emitting element and avoids the problem of the IR drop due to over-length of the power supply wires, so that the data signal is output normally, thereby ensuring the luminance uniformity of the display screen.

According to another aspect of the present disclosure, there is provided a driving method of the pixel driving circuit described above. The driving method comprises a plurality of driving cycles, each of which comprises a first phase, a second phase and a third phase, wherein, in the first phase, the reset unit writes the first power supply voltage into the first terminal of the capacitor, to eliminate a voltage of the first terminal of the capacitor in the third phase of a previous driving cycle, the data writing unit writes the data signal into the second terminal of the capacitor, and the compensation unit provides the reference voltage to the first node; in the second phase, the reset unit stops writing the first power supply voltage into the first terminal of the capacitor, so that the first terminal of the capacitor is discharged; in the third phase, the light emitting control unit provides the light emitting current to the light emitting device for making it emit light, and reduce the voltage of the first node, and the compensation unit writes the reduced voltage of the first node into the second terminal of the capacitor, so that the voltage of the first terminal of the capacitor jumps according to a variation of a voltage of the second terminal of the capacitor.

According to another aspect of the present disclosure, there is provided a display apparatus comprising the pixel driving circuit described above.

Compared with the prior art, the beneficial effects of the driving method of the pixel driving circuit and the display apparatus provided in the present disclosure are the same as the beneficial effects of the pixel driving circuit provided in the above technical solution, and thus no further description is given herein.

BRIEF DESCRIPTION OF THE DRAWINGS

Preferable embodiments of the present disclosure will be described in detail by combining with accompanying figures. The above and other purposes, characteristics and advantages of the present disclosure will become clearer, wherein same reference marks designate units with a same structure, and wherein.

DETAILED DESCRIPTION

Technical solutions in embodiments of the present disclosure will be described clearly and completely by combining with figures in the embodiments of the present disclosure. Obviously, the embodiments described below are just a part embodiments of the present disclosure, but not all the embodiments of the present disclosure. Based on the embodiments of the present disclosure, all the other embodiments obtained by those ordinary skilled in the art without making any inventive labor belong to the scope sought for protection in the present disclosure.

Transistors adopted in all the embodiments of the present disclosure can be thin film transistors or field effect transistors or other devices having the same characteristics. In the present embodiment, connection manners of a drain and a source of each transistor can be exchanged with each other. Drains and sources of respective transistors in the embodiments of the present disclosure have no distinction. Herein, for the purpose of convenient description, one of a drain and a source of a transistor is referred to as a first electrode of the transistor, and the other thereof is referred to as a second electrode of the transistor.

Figure 1:
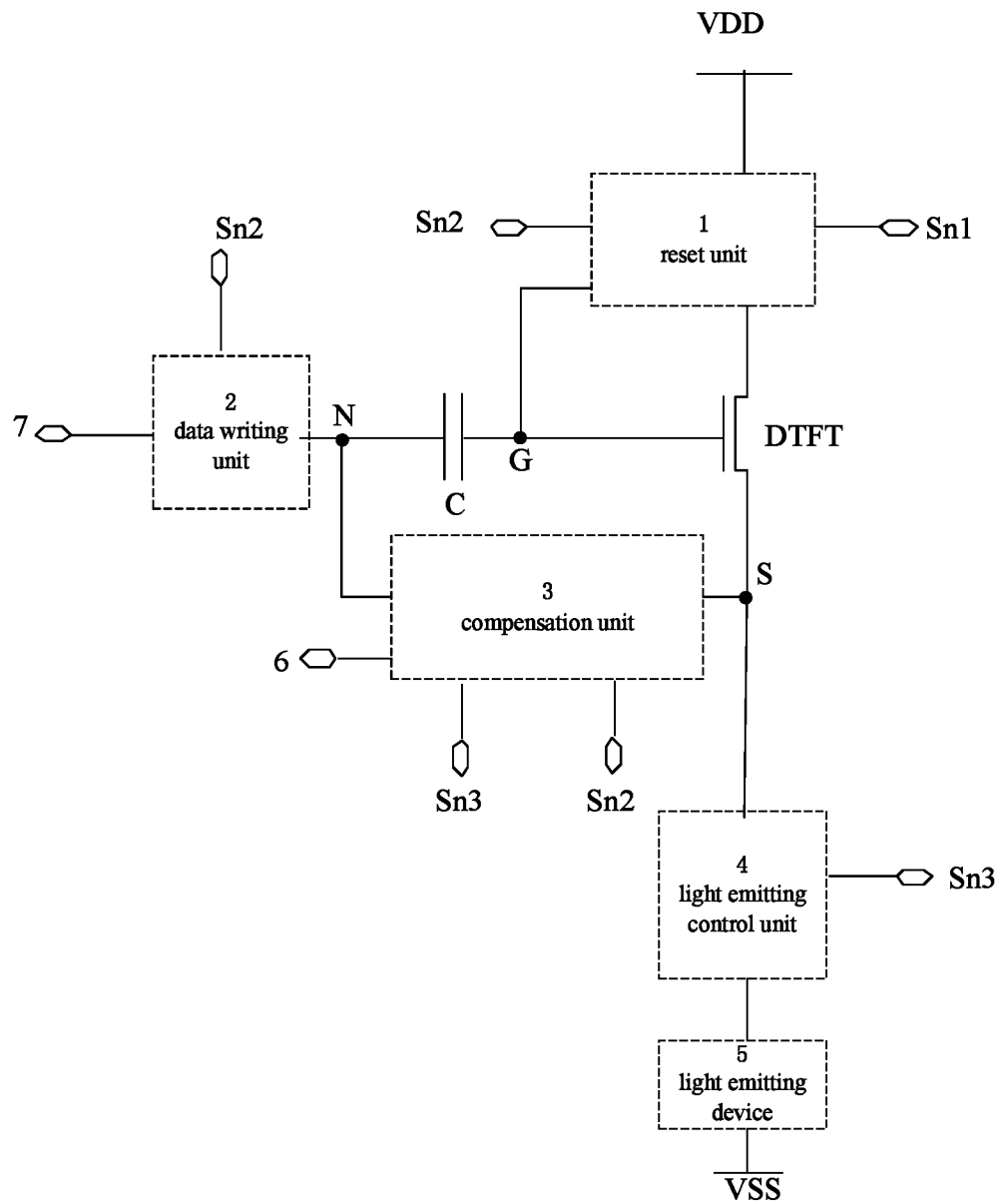
FIG. 1 shows a block diagram of a pixel driving circuit according to an embodiment of the present disclosure.

FIG. 1 shows a block diagram of a pixel driving circuit according to an embodiment of the present disclosure. As shown in FIG. 1, in one embodiment, the pixel driving circuit comprises: a capacitor C, a reset unit 1, a data writing unit 2, a compensation unit 3, a light emitting control unit 4, a driving transistor DTFT and a light emitting device 5.

The reset unit 1 is connected to a first power supply voltage terminal VDD, a first control signal terminal Sn1, a second control signal terminal Sn2, a first terminal of the capacitor C, a first electrode of the driving transistor DTFT and a control terminal of the driving transistor DTFT. The reset unit 1 is configured to write a first power supply voltage of the first power supply voltage terminal VDD into the first terminal of the capacitor C under control of a first control signal of the first control signal terminal Sn1 and a second control signal of the second control signal terminal Sn2.

The date writing unit 2 is connected to the second control signal terminal Sn2, a data signal terminal 7 and a second terminal of the capacitor C. The data writing unit 2 is configured to write a data signal of the data signal terminal 7 into the second terminal of the capacitor C under control of the second control signal of the second control signal terminal Sn2.

The compensation unit 3 is connected to the second control signal terminal Sn2, a third control signal terminal Sn3, a reference voltage signal terminal 6, the second terminal of the capacitor C and a first node S, wherein the first node S is a connection point of a second electrode of the driving transistor DTFT, the compensation unit 3 and the light emitting control unit 4. The compensation unit 3 is configured to provide a reference voltage of the reference voltage signal terminal 6 to the first node S under control of the second control signal of the second control signal terminal Sn2, and write a voltage of the first node S into the second terminal of the capacitor C under control of a third control signal of the third control signal terminal Sn3.

The light emitting control unit 4 is connected to the third control signal terminal Sn3, the first node S and a first terminal of the light emitting device 5. The light emitting control unit 4 is configured to provide a light emitting current to the light emitting device 5 to make it emit light and reduce the voltage of the first node S under control of the third control signal of the third control signal terminal Sn3.

The first terminal of the capacitor C is connected to the control terminal of the driving transistor DTFT.

A second terminal of the light emitting device 5 is connected to the second power supply voltage terminal VSS.

Figure 2:
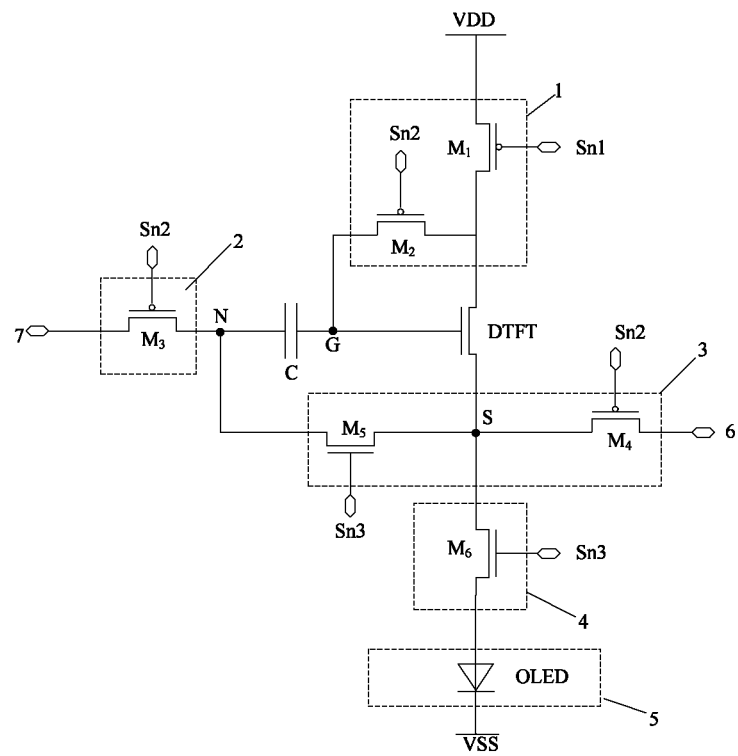
FIG. 2 shows one schematic structural diagram of a pixel driving circuit according to an embodiment of the present disclosure.

FIG. 2 shows one schematic structure diagram of a pixel driving circuit according to an embodiment of the present disclosure.

As shown in FIG. 2, in one embodiment, for example, the reset unit 1 comprises: a first transistor M1 and a second transistor M2. A control terminal of the first transistor M1 receives a first control signal Scan1 input by the first control signal terminal Sn1, a first electrode thereof receives the first power supply voltage VVDD input by the first power supply voltage terminal VDD, and a second electrode thereof is connected to the first electrode of the driving transistor DTFT. A control terminal of the second transistor M2 receives a second control signal Scan2 input by the second control signal terminal Sn2, a first electrode thereof is connected to the second electrode of the first transistor M1, and a second electrode thereof is connected to the first terminal of the capacitor C.

In one embodiment, for example, the data writing unit 2 comprises: a third transistor M3. A control terminal of the third transistor M3 receives the second control signal input by the second control signal terminal Sn2, a first electrode thereof receives a data signal Vdata input by the data signal terminal 7, and a second electrode thereof is connected to the second terminal of the capacitor C.

In one embodiment, for example, the compensation unit 3 comprises: a fourth transistor M4 and a fifth transistor M5. A control terminal of the fourth transistor M4 receives the second control signal Scan2 input by the second control signal terminal Sn2, a first electrode thereof receives the reference voltage signal Vref input by the reference voltage signal terminal 6, and a second electrode thereof is connected to the second electrode of the driving transistor DTFT and the light emitting control unit 4 respectively. A control terminal of the fifth transistor M5 receives the third control signal Scan3 input by the third control signal terminal Sn3, a first electrode thereof is connected to the second electrode of the fourth transistor M4, and a second electrode thereof is connected to the second terminal of the capacitor C.

In one embodiment, for example, the light emitting control unit 4 comprises: a sixth transistor M6. A control terminal of the sixth transistor M6 receives the third control signal Scan3 input by the third control signal terminal Sn3, a first electrode thereof is connected to the second electrode of the driving transistor DTFT, and a second electrode thereof is connected to the first terminal of the light emitting device 5.

In one embodiment, for example, the light emitting device 5 is an organic light emitting diode OLED. An anode of the organic light emitting diode OLED is connected to the second electrode of the sixth transistor M6, and a cathode thereof is connected to the second power supply voltage terminal VSS.

Herein, it can be understood that the first power supply voltage VVDD at a high potential provided by the first power supply voltage terminal and the second power supply voltage VVSS at a low potential provided by the second power supply voltage used in the pixel driving circuit according to the above embodiments are provided by external power supplies.

It needs to specify that the driving transistor DTFT can have a variety of models. For example, the driving transistor DTFT provided in the present embodiment is an N type transistor. In particular, it can be an N-channel MOSFET.

Additionally, there may be a variety of models for the first transistor M1 to the sixth transistor M6 mentioned in the present disclosure. Any one of the first transistor M1 to the sixth transistor M6 can be a N type transistor or can be a P type transistor, the only difference is that level signals for controlling turn-on or turn-off of each transistor are different. However it must be guaranteed that the first transistor M1 to the sixth transistor M6 can be turned on or turned off quickly and reliably. The present disclosure exemplarily illustrates two kinds of structures of the pixel driving circuit in FIGS. 2 and 3.

In the embodiment as shown in FIG. 2, the second transistor M2, the third transistor M3 and the fourth transistor M4 are under control of a same control signal, i.e., the second control signal, so that the second transistor M2, the third transistor M3 and the fourth transistor M4 are all P type transistors; the fifth transistor M5 and the sixth transistor M6 are under control of a same control signal, i.e., the third control signal, so that the fifth transistor M5 and the sixth transistor M6 are both N type transistors. Optionally, in the embodiment, the first transistor M1 is also a P type transistor.

Figure 3:
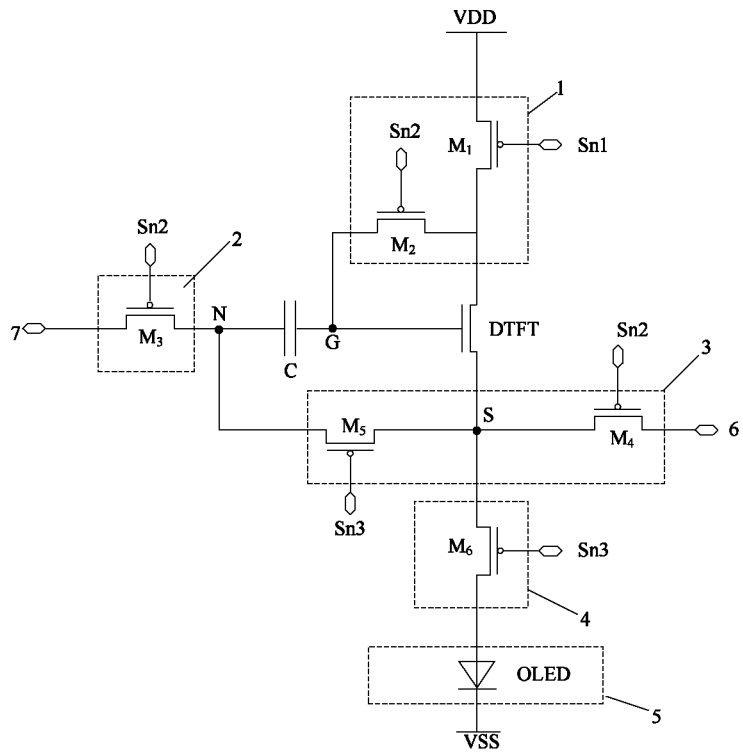
FIG. 3 shows another schematic structural diagram of a pixel driving circuit according to an embodiment of the present disclosure.

FIG. 3 shows another schematic structure diagram of a pixel driving circuit according to an embodiment of the present disclosure. In particular, connection manners of the first transistor M1 to the sixth transistor M6 of the pixel driving circuit in FIG. 3 are the same as those of the pixel driving circuit in FIG. 2. The difference is that the first transistor M1 to the sixth transistor M6 of the pixel driving circuit in FIG. 3 are all P type transistors.

In one embodiment, the first power supply voltage VVDD is greater than a sum of the reference voltage Vref and a threshold voltage Vth of the driving transistor, and the voltage Vdata of the data signal is smaller than a sum of the reference voltage Vref and the threshold voltage Vth of the driving transistor.

There is further provided in the present disclosure a driving method of the pixel driving circuit described above. In one embodiment, the pixel driving circuit comprises: a capacitor C, a reset unit 1, a data writing unit 2, a compensation unit 3, a light emitting control unit 4, a driving transistor DTFT and a light emitting device 5. The driving method comprises a plurality of driving cycles, each of which comprises:

In a first phase, the reset unit 1 writes the first power supply voltage VVDD into the first terminal of the capacitor C, to eliminate the voltage of the first terminal of the capacitor C during a third phase of a previous driving cycle, the data writing unit 2 writes the data signal Vdata into the second terminal of the capacitor C, and the compensation unit 3 provides the reference voltage signal Vref to a first node, wherein the first node S is the connection point of the second electrode of the driving transistor DTFT, the compensation unit 3 and the light emitting control unit 4;

In a second phase, the reset unit 1 stops writing the first power supply voltage VVDD into the first terminal of the capacitor C, so that the first terminal of the capacitor C is discharged;

In the third phase, the light emitting control unit 4 provides a light emitting current to the light emitting device to make it emit light, and reduce the voltage of the first node S, and the compensation unit 3 writes the reduced voltage of the first node S into the second terminal of the capacitor C, so that the voltage of the first terminal of the capacitor C jumps according to a variation of the voltage of the second terminal of the capacitor C.

Figure 4:
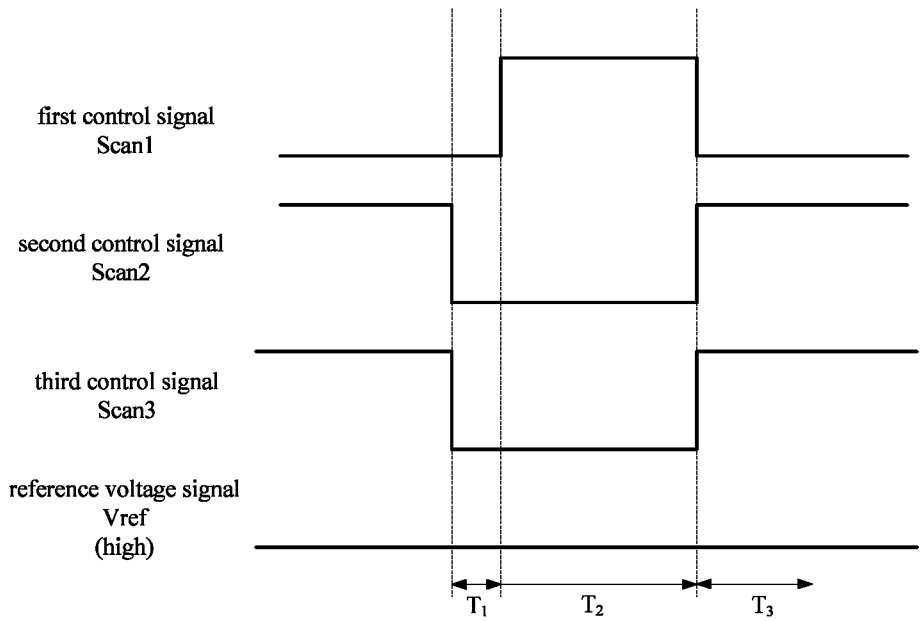
FIG. 4 shows a schematic diagram of driving signals of the pixel driving circuit in FIG. 2.

A method for driving one circuit with a first structure as illustrated in the present disclosure will be described below by combining with FIGS. 2 and 4. FIG. 4 shows a schematic diagram of driving signals of the pixel driving circuit in FIG. 2. Herein, the second transistor M2, the third transistor M3 and the fourth transistor M4 of the pixel driving circuit in FIG. 2 are P type transistors and both the fifth transistor M5 and the sixth transistor M6 are N type transistors. Correspondingly, in FIG. 4, the second control signal for controlling the second transistor M2, the third transistor M3 and the fourth transistor M4 is the same as the third control signal for controlling the fifth transistor M5 and the sixth transistor M6.

In one embodiment, the operation process of the pixel driving circuit comprises, within one driving cycle, the following three phases sequentially: a first phase T1, a second phase T2 and a third phase T3.

In the first phase T1, the first control signal Scan 1 is at a low level, the second control signal Scan2 is at a low level, and the third control signal Scan3 is at a low level.

Under driving of the first control signal Scan1, the first transistor M1 is controlled to be turned on.

Under driving of the second control signal Scan2, the second transistor M2 is controlled to be turned on, so that the first power supply voltage VVDD is output from the second electrode of the first transistor M1 to the first electrode of the second transistor M2, and then is output to the first terminal of the capacitor C and a second node G via the second electrode of the second transistor M2, to eliminate a voltage of the first terminal of the capacitor C during the third phase T3 of the previous driving cycle. At this time, the voltage at the second node G is VVDD. Since the control terminal of the driving transistor DTFT is connected to the second node G, i.e., being connected to the first terminal of the capacitor C, the driving transistor DTFT is turned on in this phase. Under the driving of the second control signal Scan2, the third transistor M3 is turned on, the data signal Vdata is output from the first electrode of the third transistor M3 to the second terminal of the capacitor C and a third node N, and at this time, the voltage at the third node N is Vdata. Under the driving of the second control signal Scan2, the fourth transistor M4 is turned on, the reference voltage signal Vref is output from the first electrode of the fourth transistor M4 to the first mode S, and at this time, the voltage at the first node S is Vref.

Under driving of the third control signal Scan3, the sixth transistor M6 is controlled to be turned off, so that the organic light emitting diode OLED does not emit light.

In the second phase T2, the first control signal Scan1 is at a high level, the second control signal Scan2 is at a low level, and the third control signal Scan3 is at a low level.

Under the driving of the second control signal Scan2, the second transistor M2, the third transistor M3, and the fourth transistor M4 are controlled to be turned on.

Under the driving of the first control signal Scan1, the first transistor M1 is controlled to be turned off, so that the first power supply voltage VVDD cannot be output to the first terminal of the capacitor C and the second node G. The first terminal of the capacitor C is discharged through a return circuit formed by the second transistor M2, the driving transistor DTFT and the fourth transistor M4. When the capacitor C is discharged to the voltage at its first terminal being less than Vref+Vth, the driving transistor DTFT is turned off, and the capacitor C stops discharging, wherein Vth is a threshold voltage of the driving transistor DTFT. In other words, the capacitor C is discharged until the driving transistor DTFT is turned off. At this time, the voltage of the second node G is reduced from VVDD to Vref+Vth, the voltage of the first node S is still Vref, and the voltage of the third node N is still Vdata.

Under the driving of the third control signal Scan3, the sixth transistor M6 is controlled to be turned off, so that the organic light emitting diode OLED does not emit light.

It should be noted that in order to make the driving transistor DTFT turned off, a gate-source voltage Vgs of the driving transistor DTFT must be smaller than the threshold voltage Vth of the driving transistor DTFT. When discharging of the capacitor C is completed, the driving transistor DTFT is at a critical point for turn-on and turn-off. At this time, the voltage of the second node G is Vref+Vth.

In the third phase T3, the first control signal Scan1 is at a low level, the second control signal Scan2 is at a high level, and the third control signal Scan3 is at a high level.

Under the driving of the first control signal Scan1, the first transistor M1 is controlled to be turned on.

Under the driving of the second control signal Scan2, the second transistor M2, the third transistor M3 and the fourth transistor M4 are controlled to be turned off.

Under the driving of the third control signal Scan3, the fifth transistor M5 and the sixth transistor M6 are controlled to be turned on, so that the voltage of the first node S is reduced to Vs. Since the second electrode of the driving transistor DTFT is connected to the first node S, the voltage of the second electrode of the driving transistor DTFT is reduced accordingly, and at this time, the driving transistor DTFT is turned on again. The voltage Vs of the first node S is transmitted to the second terminal of the capacitor C through the fifth transistor M5, so that the voltage of the second terminal of the capacitor C is Vs, that is, the voltage at the third node N is Vs. In this way, a variation of Vs−Vdata for the voltage of the second terminal of the capacitor C is transferred to the first terminal of the capacitor C, thus the voltage of the first terminal of the capacitor C is Vref+Vth+Vs−Vdata, so that the driving transistor DTFT maintains in a turn-on state. The first power supply voltage VVDD is output to the organic light emitting diode through the first transistor M1, the driving transistor DTFT and the sixth transistor M6, so that the organic light emitting diode emits light.

It should be noted that the gate-source voltage of the driving transistor DTFT is Vgs=Vref+Vth−Vdata at this phase. A calculation equation of a current flowing through the driving transistor DTFT is:

$$I_{OLED}=0.5\mu nCox(W/L)(V_{gs}-V_{th})^2, \quad \text{equation 1}$$

where $I_{OLED}$ is the current flowing through the driving transistor DTFT; μn is a mobility of carriers; Cox is a capacitance of a insulation layer per unit area; W is a channel width of the driving transistor; L is a channel length of the driving transistor; $V_{gs}$ is a gate-source voltage of the driving transistor; $V_{th}$ is a threshold voltage of the driving transistor.

The gate-source voltage of the driving transistor DTFT in this phase, i.e., Vgs=Vref+Vth−Vdata, is brought into the equation 1 to obtain the current flowing through the driving transistor DTFT:

$$I_{OLED}=0.5\mu nCox(W/L)(V_{ref}-V_{data})^2. \quad \text{equation 2}$$

It can be seen from the equation 2 that if other parameters are unchanged, the magnitude of the current flowing through the driving transistor DTFT is controlled by the reference voltage signal and the data signal, and is unrelated with the threshold voltage of the driving transistor, the first power supply voltage VVDD and the second power supply voltage VVSS, which eliminates the influence of the threshold voltage of the driving transistor, the first power supply voltage VVDD and the second power supply voltage VVSS on the current flowing through the light-emitting device, realizes compensation for the IR drop of the second power supply voltage, and avoids the problem of the IR Drop due to the power supply wires being too long, so that the data signal can be output normally, thereby ensuring the luminance of the display screen uniform.

In one embodiment, the first power supply voltage VVDD is greater than a sum of the reference voltage Vref and the threshold voltage Vth of the driving transistor, and the voltage Vdata of the data signal is smaller than the sum of the reference voltage Vref and the threshold voltage Vth of the driving transistor.

In addition, the present embodiment introduces the provided pixel driving circuit by taking the above specific circuit structure as an example. In other embodiments of the present disclosure, the reset unit 1, the data writing unit 2, the compensation unit 3, the light emitting control unit 4 of pixel driving circuit can be realized by other structures respectively, to which no further details are given.

It can be understood that the driving transistor DTFT can have many kinds of models. The driving transistor DTFT provided in the present embodiment can be an N type transistor. In particular, it would be an N channel MOSFET; the second electrode of the N type transistor is connected to the first node S, and in the third phase, the voltage of the first node S is provided by the second power supply voltage, whereas in the equation 2 of calculating the current, the voltage of the first node S is eliminated. Therefore, the setting of the N type transistor enables that the second power supply voltage does not make any influence on the current flowing through the light emitting element, i.e., realizing compensation for the IR drop of the second power supply voltage.

Figure 5:
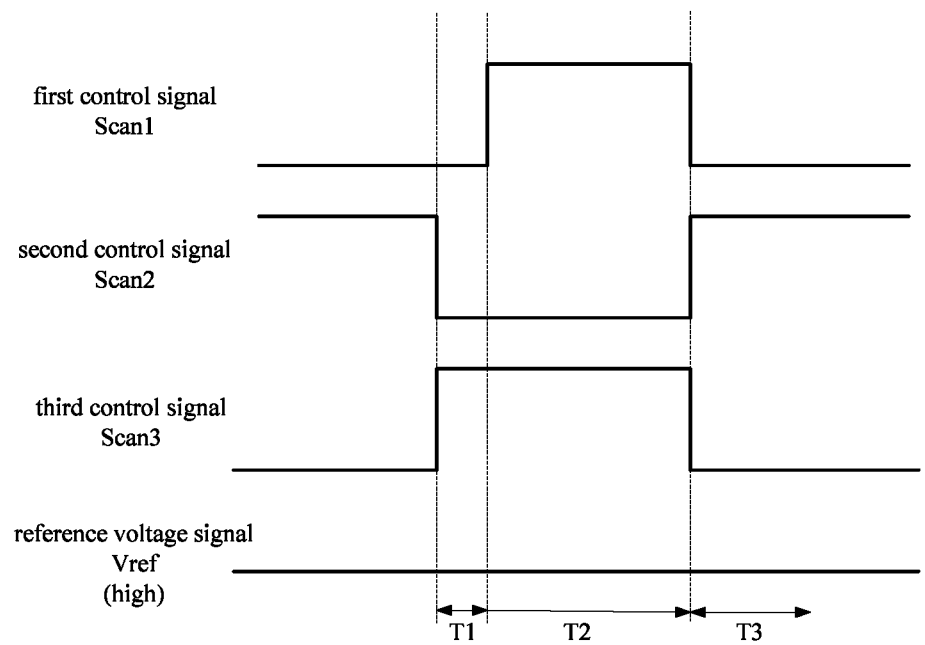
FIG. 5 shows a schematic diagram of driving signals of the pixel driving circuit in FIG. 3.

A method for driving another circuit with a second structure as illustrated in the present disclosure will be described below by combining with FIGS. 3 and 5. FIG. 5 shows a schematic diagram of the driving signal of the pixel driving circuit in FIG. 3. Herein, the second transistor M2 to the sixth transistor M6 of the pixel driving circuit in FIG. 3 are P type transistors. Accordingly, the second control signal for controlling the second transistor M2, the third transistor M3 and the fourth transistor M4 in FIG. 5 is opposite to the third control signal for controlling the fifth transistor M5 and the sixth transistor M6.

It should be noted that both the first control signal and the second control signal in the another circuit with the second structure are completely the same as the first control signal and the second control signal of the one circuit with the first structure, the cycle of the third control signal in the another circuit with the second structure is also the same as the cycle of the third control signal of the one circuit with the first structure, and only the level of the third control signal of the another circuit with the second structure is opposite to the level of the third control signal of the one circuit with the first structure. In this situation, in the first phase, when the third control signal is at a high level, the fifth transistor M5 and the sixth transistor M6 are turned off; in the second phase, when the third control signal is at the high level, the fifth transistor M5 and the sixth transistor M6 are turned off; in the third phase, when the third control signal is at a low level, the fifth transistor M5 and the sixth transistor M6 are turned on.

There is further provided in the present embodiment a display apparatus, comprising the pixel driving circuit as described in the first embodiment. The display apparatus avoids the problem of the IR Drop due to the power supply wires being too long, so that the data signal is output normally, thereby ensuring the luminance of the display screen uniform.

It needs to note that the display apparatus provided in the above embodiment can be any product or means having the function of displaying, such as a mobile phone, a tablet computer, a television set, a display, a notebook computer, a digital photo frame or a navigator, etc.

In the description of the above embodiments, specific features, structures, materials or characteristics can be combined in an appropriate way in one or more embodiments.

The above descriptions are just specific implementations of the present disclosure. However, the protection scope of the present disclosure is not limited thereto. Any alternation or replacement that can be easily conceived by those skilled in the art who are familiar with the technical field shall be covered within the protection scope of the present disclosure. Therefore, the protection scope of the present disclosure shall be subject to the protection scope of the claims.

What is claimed is:

1. A pixel driving circuit, comprising: a capacitor, a reset unit, a data writing unit, a compensation unit, a light emitting control unit, a driving transistor and a light emitting device;

the reset unit, being connected to a first power supply voltage terminal, a first control signal terminal, a second control signal terminal, a first terminal of the capacitor, a first electrode of the driving transistor and a control terminal of the driving transistor, and configured to write a first power supply voltage of the first power supply voltage terminal into the first terminal of the capacitor under control of a first control signal of the first control signal terminal and a second control signal of the second control signal terminal;

the data writing unit, being connected to the second control signal terminal, a data signal terminal and a second terminal of the capacitor, and configured to write a data signal of the data signal terminal into the second terminal of the capacitor under control of the second control signal of the second control signal terminal;

the compensation unit, being connected to the second control signal terminal, a third control signal terminal, a reference voltage signal terminal, the second terminal of the capacitor and a first node, wherein the first node is a connection point for a second electrode of the driving transistor, the compensation unit and the light emitting control unit, and the compensation unit being configured to provide a reference voltage of the reference voltage signal terminal to the first node under control of the second control signal of the second control signal terminal, and to write a voltage of the first node into the second terminal of the capacitor under control of a third control signal of the third control signal terminal;

the light emitting control unit, being connected to the third control signal terminal, the first node and a first terminal of the light emitting device, and configured to provide a light emitting current to the light emitting device for making it emit light and to reduce the voltage of the first node under control of the third control signal of the third control signal terminal;

the first terminal of the capacitor being connected to the control terminal of the driving transistor;

a second terminal of the light emitting device being connected to a second power supply voltage terminal.

2. The pixel driving circuit according to claim 1, wherein the reset unit comprises a first transistor and a second transistor; wherein, a control terminal of the first transistor is connected to the first control signal terminal, a first electrode thereof is connected to the first power supply voltage terminal, and a second electrode thereof is connected to the first electrode of the driving transistor;

a control terminal of the second transistor is connected to the second control signal terminal, a first electrode thereof is connected to the second electrode of the first transistor, and a second electrode thereof is connected to the first terminal of the capacitor.

3. The pixel driving circuit according to claim 2, wherein the data writing unit comprises a third transistor; wherein, a control terminal of the third transistor is connected to the second control signal terminal, a first electrode thereof is connected to the data signal terminal, and a second electrode thereof is connected to the second terminal of the capacitor.

4. The pixel driving circuit according to claim 3, wherein the compensation unit comprises a fourth transistor and a fifth transistor; wherein, a control terminal of the fourth transistor is connected to the second control signal terminal, a first electrode thereof is connected to the reference voltage signal terminal, and a second electrode thereof is connected to the first node;

a control terminal of the fifth transistor is connected to the third control signal terminal, a first electrode thereof is connected to the second electrode of the fourth transistor and the first node, and a second electrode thereof is connected to the second terminal of the capacitor.

5. The pixel driving circuit according to claim 4, wherein the light emitting control unit comprises a sixth transistor; wherein,
a control terminal of the sixth transistor is connected to the third control signal terminal, a first electrode thereof is connected to the second electrode of the driving transistor, and a second electrode thereof is connected to the first terminal of the light emitting device.

6. The pixel driving circuit according to claim 5, wherein the light emitting device is an organic light emitting diode, whose anode is connected to the light emitting control unit and cathode is connected to the second power supply voltage terminal.

7. The pixel driving circuit according to claim 6, wherein if the second transistor, the third transistor, the fourth transistor, the fifth transistor and the sixth transistor are P type transistors, the second control signal and the third control signal are opposite to each other;
if the second transistor, the third transistor and the fourth transistor are P type transistors and the fifth transistor and the sixth transistor are N type transistors, the second control signal and the third control signal are the same.

8. The pixel driving circuit according to claim 1, wherein the first power supply voltage is greater than a sum of the reference voltage and a threshold voltage of the driving transistor, and a voltage of the data signal is smaller than the sum of the reference voltage and the threshold voltage of the driving transistor.

9. A driving method of the pixel driving circuit according to claim 1, comprising a plurality of driving cycles, each of which comprises a first phase, a second phase and a third phase, wherein,
in the first phase, the reset unit writes the first power supply voltage into the first terminal of the capacitor, to eliminate a voltage of the first terminal of the capacitor in the third phase of a previous driving cycle, the data writing unit writes the data signal into the second terminal of the capacitor, and the compensation unit provides the reference voltage to the first node;
in the second phase, the reset unit stops writing the first power supply voltage into the first terminal of the capacitor, so that the first terminal of the capacitor is discharged;
in the third phase, the light emitting control unit provides the light emitting current to the light emitting device for making it emit light, and reduce the voltage of the first node, and the compensation unit writes the reduced voltage of the first node into the second terminal of the capacitor, so that the voltage of the first terminal of the capacitor jumps according to a variation of a voltage of the second terminal of the capacitor.

10. The driving method of the pixel driving circuit according to claim 9, wherein,
in the first phase, the driving transistor is turned on when the reset unit writes the first power supply voltage into the first terminal of the capacitor;
in the second phase, the first terminal of the capacitor is discharged until the driving transistor is turned off;
in the third phase, the driving transistor is turned on again after the voltage of the first node is reduced.

11. The pixel driving method according to claim 9, wherein the reset unit comprises a first transistor and a second transistor, the data writing unit comprises a third transistor, the compensation unit comprises a fourth transistor and a fifth transistor, and the light emitting control unit comprises a sixth transistor, and
if the second transistor, the third transistor, the fourth transistor, the fifth transistor and the sixth transistor are P type transistors, the second control signal and the third control signal are opposite to each other;
if the second transistor, the third transistor and the fourth transistor are P type transistors and the fifth transistor and the sixth transistor are N type transistors, the second control signal and the third control signal are the same.

12. The pixel driving method according to claim 9, wherein the first power supply voltage is greater than a sum of the reference voltage and a threshold voltage of the driving transistor, and a voltage of the data signal is smaller than the sum of the reference voltage and the threshold voltage of the driving transistor.

13. A display apparatus, characterized in that, the display apparatus comprising the pixel driving circuit according to claim 1.

* * * * *